(12) United States Patent
Hatwar et al.

(10) Patent No.: US 7,332,860 B2
(45) Date of Patent: Feb. 19, 2008

(54) EFFICIENT WHITE-LIGHT OLED DISPLAY WITH FILTERS

(75) Inventors: Tukaram K. Hatwar, Penfield, NY (US); Jeffrey P. Spindler, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 5 days.

(21) Appl. No.: 11/393,767

(22) Filed: Mar. 30, 2006

(65) Prior Publication Data

US 2007/0228938 A1   Oct. 4, 2007

(51) Int. Cl.
*H01J 1/62*     (2006.01)
*H01J 63/04*    (2006.01)

(52) U.S. Cl. ............... 313/504; 313/498; 313/503; 313/506

(58) Field of Classification Search ........ 313/498–512; 315/169.1, 169.3; 428/690–691, 917; 438/26–29, 438/34, 82; 257/40, 72, 98–100, 642–643, 257/759; 427/66, 532–535, 539
See application file for complete search history.

(56) References Cited

U.S. PATENT DOCUMENTS

| | | | |
|---|---|---|---|
| 4,769,292 A | | 9/1988 | Tang et al. |
| 4,885,211 A | | 12/1989 | Tang et al. |
| 5,598,059 A | * | 1/1997 | Sun et al. .................. 313/509 |
| 5,683,823 A | | 11/1997 | Shi et al. |
| 5,811,833 A | * | 9/1998 | Thompson .................. 257/40 |
| 6,107,734 A | | 8/2000 | Tanaka et al. |
| 6,337,492 B1 | | 1/2002 | Jones et al. |
| 6,717,358 B1 | | 4/2004 | Liao et al. |
| 6,872,472 B2 | * | 3/2005 | Liao et al. .................. 428/690 |
| 2003/0170491 A1 | | 9/2003 | Liao et al. |

(Continued)

FOREIGN PATENT DOCUMENTS

EP          1784056          5/2007

(Continued)

OTHER PUBLICATIONS

Applied Physics Letters 64 (7), Feb. 14, 1994, pp. 815-817; entitled *White Light-emitting Organic Electroluminescent Devices Using The Poly(N-vinylcarbazole) Emitter Lalyer kDoped With Three Fluorescent Dyes*; by J. Kido et al.

(Continued)

*Primary Examiner*—Mariceli Santiago
*Assistant Examiner*—José M Diaz
(74) *Attorney, Agent, or Firm*—Raymond L. Owens

(57) ABSTRACT

A white light-emitting OLED device comprising: an anode and a cathode; at least four light-emitting layers provided between the anode and the cathode, wherein each of the four light-emitting layers produces a different emission spectrum when current passes between the anode and cathode, and such spectra combine to form white light; and wherein the four light-emitting layers include a red light-emitting layer, a yellow light-emitting layer, a blue light-emitting layer, and a green light-emitting layer, arranged such that: i) each of the light-emitting layers is in contact with at least one other light-emitting layer, ii) the blue light-emitting layer is in contact with the green light-emitting layer, and iii) the red light-emitting layer is in contact with only one other light-emitting layer.

32 Claims, 7 Drawing Sheets

U.S. PATENT DOCUMENTS

| | | |
|---|---|---|
| 2003/0189401 A1 | 10/2003 | Kido et al. |
| 2006/0040132 A1 | 2/2006 | Liao et al. |
| 2006/0087225 A1* | 4/2006 | Liao et al. ................. 313/504 |
| 2006/0152143 A1* | 7/2006 | Nakaya et al. ............. 313/504 |
| 2006/0244370 A1* | 11/2006 | Tyan et al. ................ 313/506 |
| 2007/0001587 A1* | 1/2007 | Hatwar et al. ............. 313/504 |
| 2007/0001588 A1* | 1/2007 | Boroson et al. ............ 313/504 |
| 2007/0048545 A1* | 3/2007 | Hatwar et al. ............. 428/690 |

FOREIGN PATENT DOCUMENTS

| | | |
|---|---|---|
| JP | 07-142169 | 6/1995 |
| JP | 2003-045676 | 2/2003 |
| JP | 2006/040856 | 2/2006 |
| JP | 2006040856 A * | 2/2006 |
| WO | WO 2006/009024 | 1/2006 |

OTHER PUBLICATIONS

Applied Physics Letters, vol. 83, No. 12, Sep. 22, 2003, pp. 2459-2461; entitled *High-efficiency White Phosphorescent Organic Light-emitting Devices with Greenish-blue and Red-emitting Layers*; by Tokito et al.

SID 03 Digest, pp. 979-981; (2003); entitled *27.5L: Late-News Paper: Multiphoton Organic EL Device Having Charge Generation Layer*; by Toshio Matsumoto et al.

* cited by examiner

EFFICIENT WHITE-LIGHT OLED DISPLAY WITH FILTERS

CROSS REFERENCE TO RELATED APPLICATIONS

Reference is made to commonly assigned U.S. Patent Publication No. 2005/0181232, published Aug. 18, 2005, entitled "Anthracene Derivative Host Having Ranges Of Dopants" by Ricks et al.; U.S. Patent Publication No. 2005/0181232, published Nov. 10, 2005, entitled "Improved Tuned Microcavity Color OLED Display" by Hatwar et al.; and U.S. patent application Ser. No. 11/170,681, filed Jun. 29, 2006, entitled "White Light Tandem Oled Display With Filters" by Hatwar et al.; the disclosures of which are incorporated herein by reference.

FIELD OF THE INVENTION

The present invention relates to broadband light-producing OLED displays with color filters.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing-angle, and capability for full color displays and for other applications. Tang et al. described this multilayer OLED in their U.S. Pat. Nos. 4,769,292 and 4,885,211.

OLEDs can emit different colors, such as red, green, blue, or white, depending on the emitting property of its LEL. Recently, there is an increasing demand for broadband OLEDs to be incorporated into various applications, such as a solid-state lighting source, color display, or a full color display. By broadband emission, it is meant that an OLED emits sufficiently broad light throughout the visible spectrum so that such light is used in conjunction with filters or color change modules to produce displays with at least two different colors or a full color display. In particular, there is a need for broadband-light-emitting OLEDs (or broadband OLEDs) where there is substantial emission in the red, green, and blue portions of the spectrum, i.e., a white light-emitting OLED (white OLED). The use of white OLEDs with color filters provides a simpler manufacturing process than an OLED having separately patterned red, green, and blue emitters. This can result in higher throughput, increased yield, and cost savings. White OLEDs have been reported in the prior art, such as reported by Kido et al. in *Applied Physics Letters*, 64, 815 (1994), J. Shi et al. in U.S. Pat. No. 5,683,823, Sato et al. in JP 07-142169, Deshpande et al. in *Applied Physics Letters*, 75, 888 (1999), and Tokito, et al. in *Applied Physics Letters*, 83, 2459 (2003).

In order to achieve broadband emission from an OLED, more than one type of molecule has to be excited because each type of molecule only emits light with a relatively narrow spectrum under normal conditions. A light-emitting layer having a host material and one or more luminescent dopant(s) can achieve light emission from both the host and the dopant(s) resulting in a broadband emission in the visible spectrum if the energy transfer from the host material to the dopant(s) is incomplete. To achieve a white OLED having a single light-emitting layer, the concentrations of light-emitting dopants need to be carefully controlled. This produces manufacturing difficulties. A white OLED having two or more light-emitting layers can have better color as well as better luminance efficiency than a device with one light-emitting layer, and the variability tolerance for dopant concentration is higher. It has also been found that white OLEDs having two light-emitting layers are typically more stable than OLEDs having a single light-emitting layer. However, it is difficult to achieve light emission with strong intensity in the red, green, and blue portions of the spectrum. A white OLED with two light-emitting layers typically has two intensive emission peaks. It is known to use a third light-emitting layer to provide a third intensive emission peak, but such a three-layer structure shows diminished efficiency.

Recently, a tandem OLED structure (sometimes called a stacked OLED or cascaded a OLED) has been disclosed by Jones et al. in U.S. Pat. No. 6,337,492, Tanaka et al. in U.S. Pat. No. 6,107,734, Kido et al. in JP Patent Publication 2003/045676A and in U.S. Patent Publication 2003/0189401 A1, and Liao et al. in U.S. Pat. No. 6,717,358 and U.S. Patent Application Publication 2003/0170491 A1. This tandem OLED is fabricated by stacking several individual OLED units vertically and driving the stack using a single power source. The advantage is that luminance efficiency, lifetime, or both are increased. However, the tandem structure increases the driving voltage approximately in proportion to the number of OLED units stacked together.

Matsumoto and Kido et al. reported in *SID 03 Digest*, 979 (2003) that a tandem white OLED is constructed by connecting a greenish blue EL unit and an orange EL unit in the device, and white light emission is achieved by driving this device with a single power source. Although luminance efficiency is increased, this tandem white OLED device has weaker green and red color components in the spectrum. In U.S. Patent Application Publication 2003/0170491 A1, Liao et al. describe a tandem white OLED structure by connecting a red Et unit, a green EL unit, and a blue EL unit in series within the device. When the tandem white OLED is driven by a single power source, white light emission is formed by spectral combination from the red, green, and blue EL units. Although color emission and luminance efficiency is improved, this tandem white OLED cannot be made with less than three EL units, implying that it requires a drive voltage at least 3 times as high as that of a conventional OLED.

A need exists for displays that are simple to make, but also have effective color gamut and high efficiency.

SUMMARY OF THE INVENTION

It is therefore an object of the present invention to produce an OLED display that is simple to make and has good color gamut and improved efficiency.

This object is achieved by a white light-emitting OLED comprising:

a) an anode and a cathode;

b) at least four light-emitting layers provided between the anode and the cathode, wherein each of the four light-emitting layers produces a different emission spectrum when current passes between the anode and cathode, and such spectra combine to form white light; and c) wherein the four light-emitting layers include a red light-emitting layer, a yellow light-emitting layer, a blue light-emitting layer, and a green light-emitting layer, arranged such that:
  i) each of the light-emitting layers is in contact with at least one other light-emitting layer,
  ii) the blue light-emitting layer is in contact with the green light-emitting layer, and
  iii) the red light-emitting layer is in contact with only one other light-emitting layer.

ADVANTAGES

It is an advantage of the present invention that it provides for a device with improved color gamut and improved power efficiency, with lower voltage requirements, high stability, and better angular dependence.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" is used in its art-recognized meaning of a display device comprising organic light-emitting diodes as pixels. It can mean a device having a single pixel. The term "OLED display" as used herein means an OLED device comprising a plurality of pixels, which can be of different colors. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. The term "hue" refers to the intensity profile of light emission within the visible spectrum, with different hues exhibiting visually discernible differences in color. The term "pixel" is employed in its art-recognized usage to designate an area of a display panel that is stimulated to emit light independently of other areas. It is recognized that in full color systems, several pixels of different colors will be used together to produce a wide range of colors, and a viewer can term such a group a single pixel. For the purposes of this discussion, such a group will be considered several different colored pixels.

In accordance with this disclosure, broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical full color display. For low power consumption, it is often advantageous for the chromaticity of the white light-emitting OLED to be close to CIE $D_{65}$, i.e., CIE x=0.31 and CIE y=0.33. This is particularly the case for so-called RGBW displays having red, green, blue, and white pixels. Although CIEx, CIEy coordinates of about 0.31, 0.33 are ideal in some circumstances; the actual coordinates can vary significantly and still be very useful. The term "white light-emitting" as used herein refers to a device that produces white light internally, even though part of such light may be removed by color filters before viewing.

Figure 1:
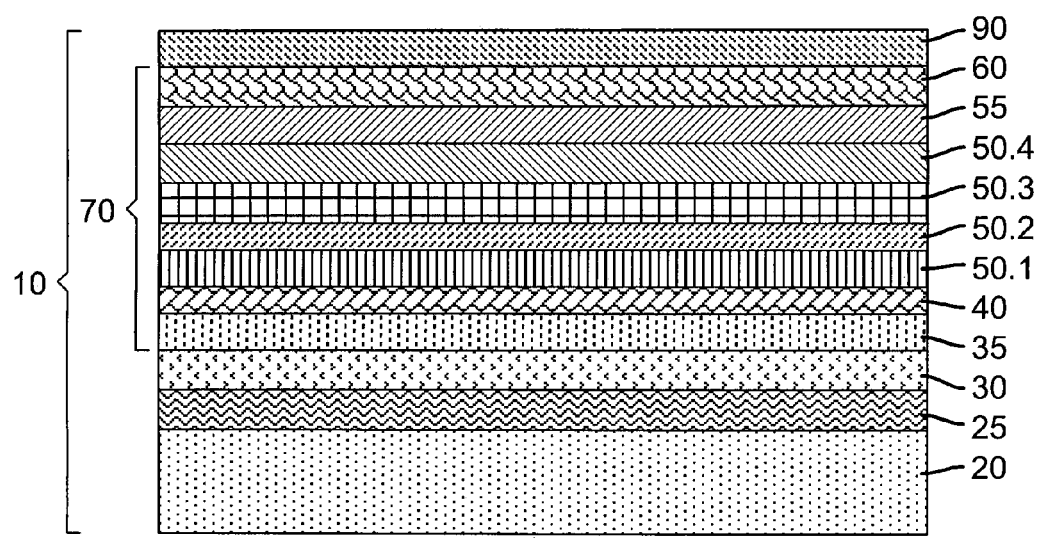
FIG. 1 shows a cross-sectional view of an OLED device in accordance with this invention.
Figure 5:
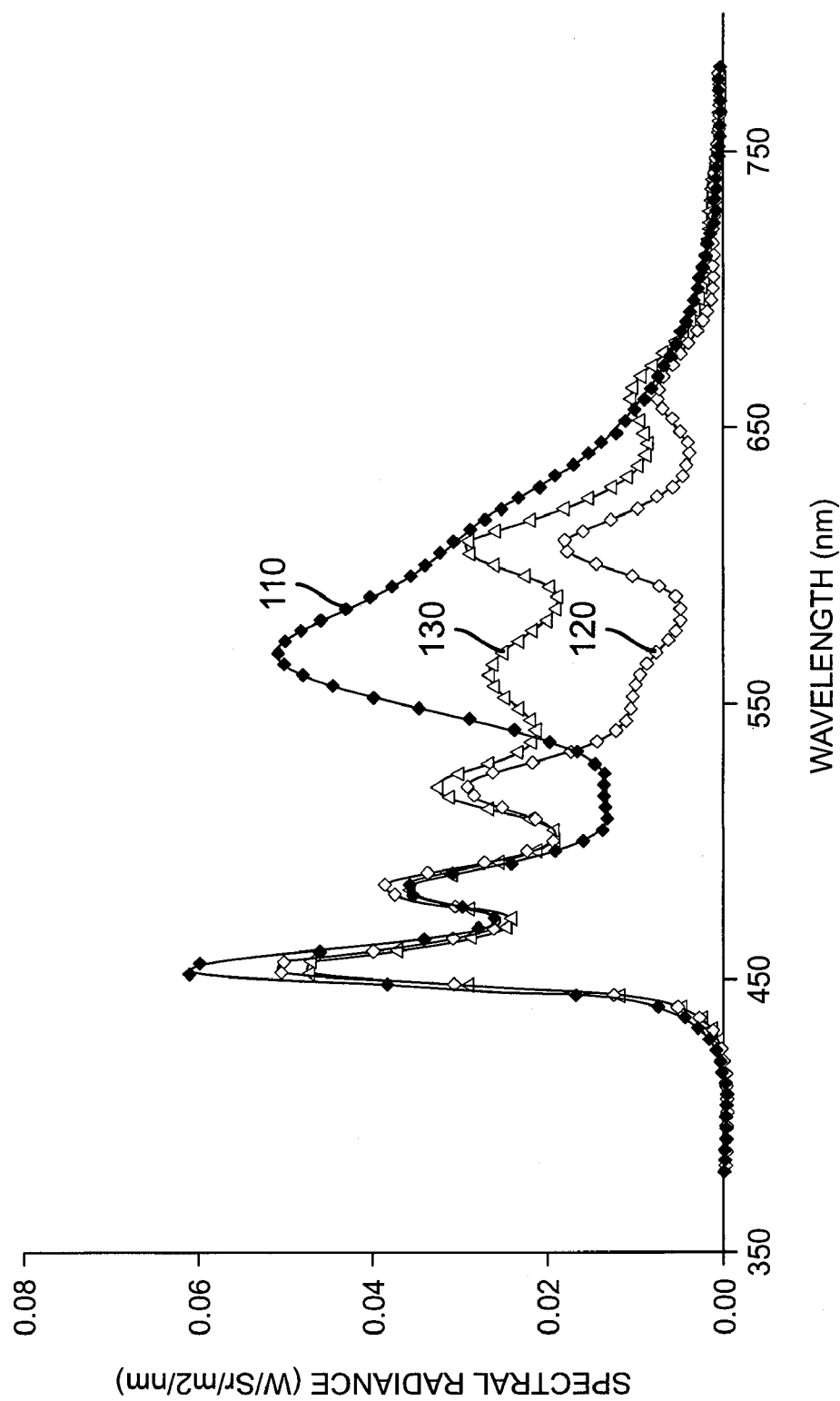
FIG. 5 shows a comparison of the emission spectrum of a four-layer white-light-emitting OLED device according to this invention with the spectra of two- and three-layer white-light-emitting OLED devices.

Turning now to FIG. 1, there is shown a cross-sectional view of a pixel of a white-light-emitting OLED device 10 according to a first embodiment of the present invention. Such an OLED device can be incorporated into e.g. a display or an area lighting system. The OLED device 10 includes at a minimum a substrate 20, an anode 30, a cathode 90 spaced from anode 30, and at least four light-emitting layers 50.1, 50.2, 50.3, and 50.4 provided between anode 30 and cathode 90. The four light-emitting layers of organic EL element 70 include a red light-emitting layer, a yellow light-emitting layer, a blue light-emitting layer, and a green light-emitting layer. The exact order of these layers will be discussed further below. Each of the light-emitting layers 50.1, 50.2, 50.3, and 50.4 produces a different emission spectrum when current passes between anode 30 and cathode 90. These emission spectra combine to form white light as shown by spectrum 130 of FIG. 5. For comparison, spectrum 110 shows the emission spectrum of a white-light-emitting OLED device that has two emitting layers: a blue-light-emitting layer and a yellow-light-emitting layer. Spectrum 120 shows the emission spectrum of a white-light-emitting OLED device that has three emitting layers: a red-light-emitting layer, a green-light-emitting layer, and a blue-light-emitting layer. Spectrum 110 is relatively weak in the green portion of the visible spectrum, so that a green-filtered pixel will need to be driven to a greater brightness. Spectrum 120 has weak emission in the yellow region, and will thus have low efficiency (in candelas/amp), especially when used in a white pixel. In contrast, spectrum 130 displays neither of these weaknesses, and has good emission across much of the visible spectrum.

OLED device 10 can further include other layers, e.g. hole-transporting layers 40, 45 electron-transporting layers 55, 65 hole-injecting layer 35, electron-injecting layer 60, and color filter 25. These will be described further below.

Figure 2A:
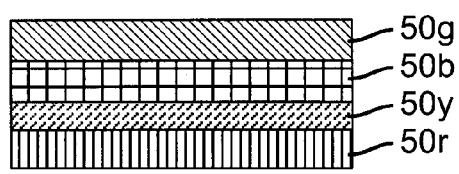
FIG. 2a to 2h show cross-sectional views of the embodiments of arrangements of the light-emitting layers in the OLED device in accordance with this invention.

An exciton formed by hole-electron recombination in the blue light-emitting layer can transfer to the green, yellow, or red light-emitting layers. An exciton in the green light-emitting layer can transfer to the yellow or red light-emitting layers, and an exciton in the yellow light-emitting layer can transfer to the red light-emitting layer. Therefore, it is important for the functioning of this invention that the light-emitting layers be arranged in an order that is energetically favorable. Such an order is achieved when the light-emitting layers are arranged such that: i) each of the light-emitting layers is in contact with at least one other light-emitting layer, ii) the blue light-emitting layer is in contact with the green light-emitting layer, and iii) the red light-emitting layer is in contact with only one other light-emitting layer. The following figures show the arrangements that meet these criteria. Turning now to FIG. 2a, there is shown a cross-sectional view of one embodiment of arrangement of the light-emitting layers in OLED device 10 fulfilling these requirements. This arrangement and the subsequent arrangements to be described can be used for any of the OLED devices and OLED displays described herein. In the arrangement of FIG. 2a, red light-emitting layer 50r is formed closest to anode 30, yellow light-emitting layer 50y is in contact with red light-emitting layer 50r, blue light-emitting layer 50b is in contact with yellow light-emitting layer 50y, and green light-emitting layer 50g is in contact with blue light-emitting layer 50b. This is an energetically favorable order. Excitons in blue light-emitting layer 50b can move to green light-emitting layer 50g or to yellow light-emitting layer 50y. Excitons in yellow light-emitting layer 50y can move to red light-emitting layer 50r. Of course, excitons in any layer can cause emission of light from that layer, and by varying the thicknesses of the different layers, one skilled in the art can tune the device for the desired emission. Since in this particular embodiment, yellow light-emitting layer 50y serves as both a light-emitting layer and a layer for transporting excitons to red light-emitting layer 50r, it is necessary that it be thinner than light-emitting layers commonly used in the art for OLED devices. Desirably, yellow light-emitting layer 50y has a thickness greater than 0.5 nm and less than 5 nm. If yellow light-emitting layer 50y is less than 0.5 nm, the emission from this layer is minimal and the device therefore would not show the beneficial efficiency increase. If yellow light-emitting layer 50y is greater than 5 nm, very few excitons will reach red light-emitting layer 50r, and therefore emission in the red region of the spectrum will be less than optimum.

Figure 2B:
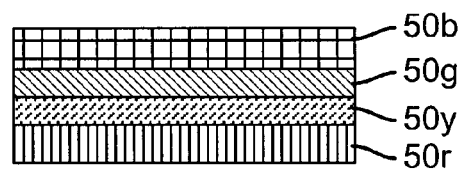

Turning now to FIG. 2b, there is shown a cross-sectional view of another embodiment of arrangement of the light-emitting layers in OLED device 10 in accordance with this invention. In this arrangement, red light-emitting layer 50r is formed closest to anode 30, yellow light-emitting layer 50y has a thickness greater than 0.5 nm and less than 5 nm and is in contact with red light-emitting layer 50r, green light-emitting layer 50g is in contact with yellow light-emitting layer 50y, and blue light-emitting layer 50b is in contact with green light-emitting layer 50g. In this embodiment, green light-emitting layer 50g serves as both an intermediate layer for transferring excitons and an emitting layer. Therefore, its thickness must be selected to balance the two functions, as was described in FIG. 2a for yellow light-emitting layer 50y. For green light-emitting layer 50g as an intermediate layer, it desirably has a thickness greater than 0.5 nm and less than 20 nm.

Figure 2C:
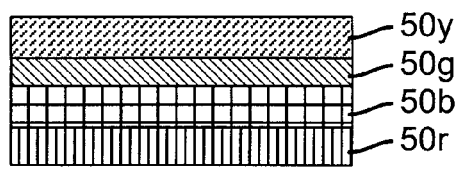

Turning now to FIG. 2c, there is shown a cross-sectional view of another embodiment of arrangement of the light-emitting layers in OLED device 10 in accordance with this invention. In this arrangement, red light-emitting layer 50r is formed closest to anode 30, blue light-emitting layer 50b is in contact with red light-emitting layer 50r, green light-emitting layer 50g has a thickness greater than 0.5 nm and less than 20 nm and is in contact with blue light-emitting layer 50b, and yellow light-emitting layer 50y is in contact with green light-emitting layer 50g.

Figure 2D:
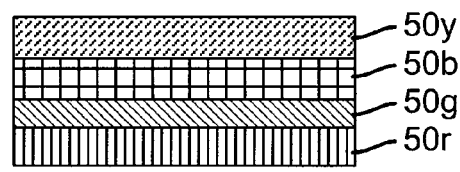

Turning now to FIG. 2d, there is shown a cross-sectional view of another embodiment of arrangement of the light-emitting layers in OLED device 10 in accordance with this invention. In this arrangement, red light-emitting layer 50r is formed closest to anode 30, green light-emitting layer 50g has a thickness greater than 0.5 nm and less than 20 nm and is in contact with red light-emitting layer 50r, blue light-emitting layer 50b is in contact with green light-emitting layer 50g, and yellow light-emitting layer 50y is in contact with blue light-emitting layer 50b.

Figure 2E:
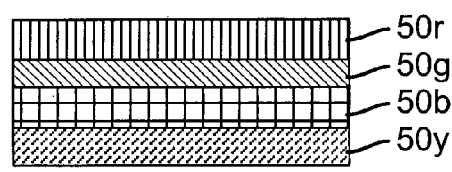

Turning now to FIG. 2e, there is shown a cross-sectional view of another embodiment of arrangement of the light-emitting layers in OLED device 10 in accordance with this invention. In this arrangement, yellow light-emitting layer 50y is formed closest to anode 30, blue light-emitting layer 50b is in contact with yellow light-emitting layer 50y, green light-emitting layer 50g has a thickness greater than 0.5 nm and less than 20 nm and is in contact with blue light-emitting layer 50b, and red light-emitting layer 50r is in contact with green light-emitting layer 50g.

Figure 2F:
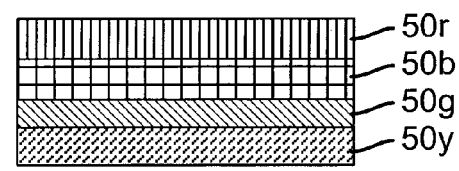

Turning now to FIG. 2f, there is shown a cross-sectional view of another embodiment of arrangement of the light-emitting layers in OLED device 10 in accordance with this invention. In this arrangement, yellow light-emitting layer 50y is formed closest to anode 30, green light-emitting layer 50g has a thickness greater than 0.5 nm and less than 20 nm and is in contact with yellow light-emitting layer 50y, blue light-emitting layer 50b is in contact with green light-emitting layer 50g, and red light-emitting layer 50r is in contact with blue light-emitting layer 50b.

Figure 2G:
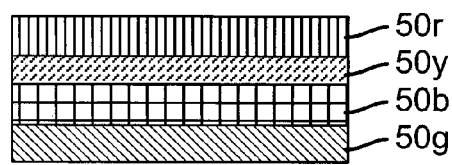

Turning now to FIG. 2g, there is shown a cross-sectional view of another embodiment of arrangement of the light-emitting layers in OLED device 10 in accordance with this invention. In this arrangement, green light-emitting layer 50g is formed closest to anode 30, blue light-emitting layer 50b is in contact with green light-emitting layer 50g, yellow light-emitting layer 50y has a thickness greater than 0.5 nm and less than 5 nm and is in contact with blue light-emitting layer 50b, and red light-emitting layer 50r is in contact with yellow light-emitting layer 50y.

Figure 2H:
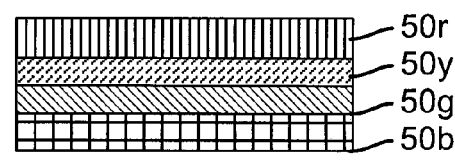

Turning now to FIG. 2h, there is shown a cross-sectional view of another embodiment of arrangement of the light-emitting layers in OLED device 10 in accordance with this invention. In this arrangement, blue light-emitting layer 50b is formed closest to anode 30, green light-emitting layer 50g has a thickness of greater than 0.5 nm and less than 20 nm and is in contact with blue light-emitting layer 50b, yellow light-emitting layer 50y has a thickness greater than 0.5 nm and less than 5 nm and is in contact with green light-emitting layer 50g, and red light-emitting layer 50r is in contact with yellow light-emitting layer 50y.

Figure 3:
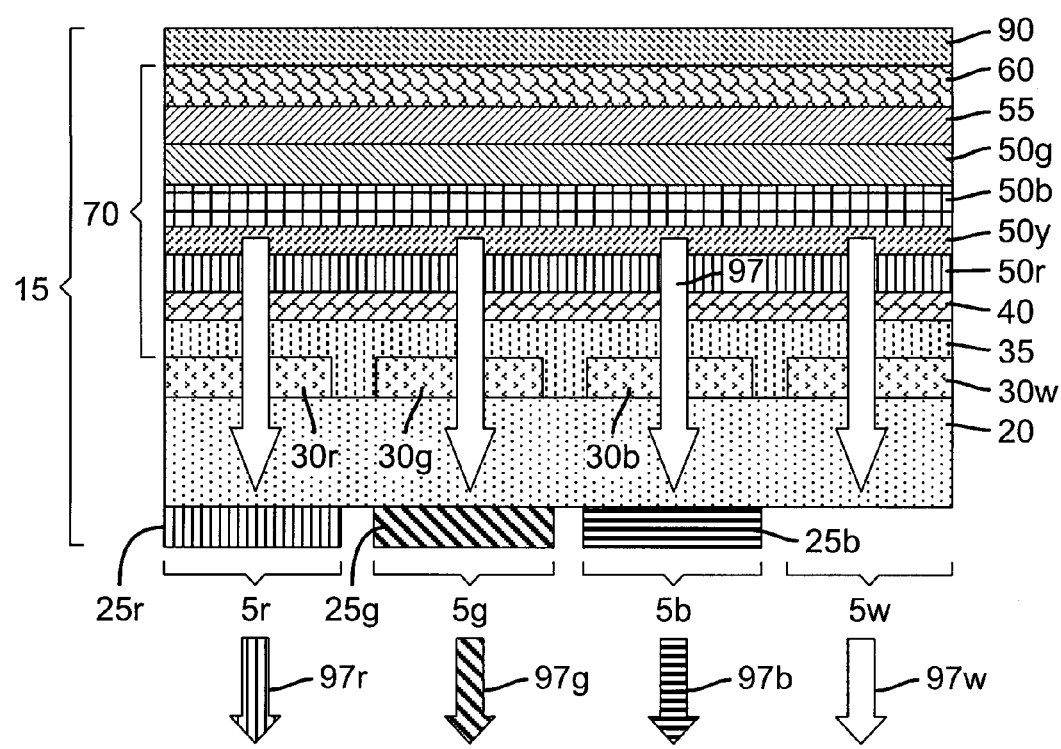
FIG. 3 shows a cross-sectional view of an OLED display in accordance with this invention.

Turning now to FIG. 3, there is shown a cross-sectional view of an OLED display 15 according to another embodiment of this invention. This embodiment is similar to the previous embodiment, but it comprises an array of first, second, third, and fourth light-emitting pixels 5r, 5g, 5b, and 5w, respectively. Pixel 5r is a red light-emitting pixel, pixel 5g is a green light-emitting pixel, pixel 5b is a blue light-emitting pixel, and pixel 5w is a white light-emitting pixel. Each pixel has an anode (e.g. anodes 30r, 30g, 30b, and 30w), a cathode (e.g. cathode 90, which in this embodiment is a common cathode shared by all pixels of the array), and at least four light-emitting layers 50.1, 50.2, 50.3, and 50.4 provided between the anode and the cathode: a red light-emitting layer, a yellow light-emitting layer, a blue light-emitting layer, and a green light-emitting layer. Each of the light-emitting layers 50.1, 50.2, 50.3, and 50.4 produces a different emission spectrum when current passes between the anode and the cathode. These emission spectra combine to form white light. The order of the light-emitting layers can be any of those described above in FIG. 2a through FIG. 2h, according to the criteria described above for OLED device 10.

OLED display 15 further includes an array of at least three different color filters, e.g. 25r, 25g, and 25b, in operative association with the first, second, and third light-emitting pixels 5r, 5g, and 5b, respectively. Such filters are selected to receive white light to produce different colored light. OLED display 15 in this embodiment is bottom-emitting. Red color filter 25r is in operative association with the first light-emitting pixel 5r to receive white light 97 from light-emitting layers 50.1 through 50.4 and produce red light 97r. Green color filter 25g is in operative association with the second light-emitting pixel 5g to receive white light 97 from the light-emitting layers and produce green light 97g. Blue color filter 25b is in operative association with the third light-emitting pixel 5b to receive white light 97 from the light-emitting layers and produce blue light 97b. Light-emitting pixel 5w does not have a color filter, and therefore produces white light 97w to a viewer.

OLED device layers that can be used in this invention have been well described in the art, and OLED device 10, OLED display 15, and other such devices described herein can include layers commonly used for such devices. A bottom electrode is formed over OLED substrate 20 and is most commonly configured as an anode 30, although the practice of this invention is not limited to this configuration. Example conductors for this application include, but are not limited to, gold, iridium, molybdenum, palladium, platinum, aluminum or silver. Desired anode materials can be deposited by any suitable means such as evaporation, sputtering, chemical vapor deposition, or electrochemical means. Anode materials can be patterned using well-known photolithographic processes.

While not always necessary, it is often useful that a hole-transporting layer 40 be formed and disposed over the anode. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

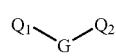

A wherein:
$Q_1$ and $Q_2$ are independently selected aromatic tertiary amine moieties; and
G is a linking group such as an arylene, cycloalkylene, or alkylene group of a carbon to carbon bond.
In one embodiment, at least one of Q1 or Q2 contains a polycyclic fused ring structure, e.g., a naphthalene. When G is an aryl group, it is conveniently a phenylene, biphenylene, or naphthalene moiety.
A useful class of triarylamines satisfying structural Formula A and containing two triarylamine moieties is represented by structural Formula B.

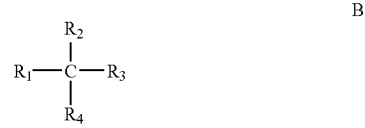

B where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

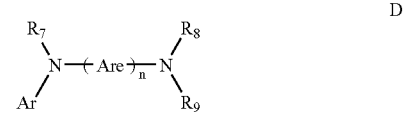

D wherein:
each Are is an independently selected arylene group, such as a phenylene or anthracene moiety;
n is an integer of from 1 to 4; and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, and D can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate), also called PEDOT/PSS.

Light-emitting layers produce light in response to hole-electron recombination. The light-emitting layers are commonly disposed over the hole-transporting layer. Desired organic light-emitting materials can be deposited by any suitable means such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layers of the OLED element comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

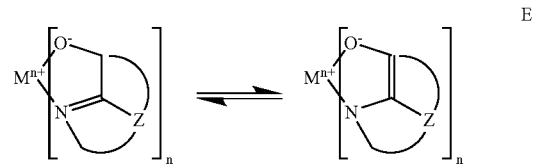

wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in the light-emitting layers can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

The red-light-emitting compound can include a diindenoperylene compound of the following structure F:

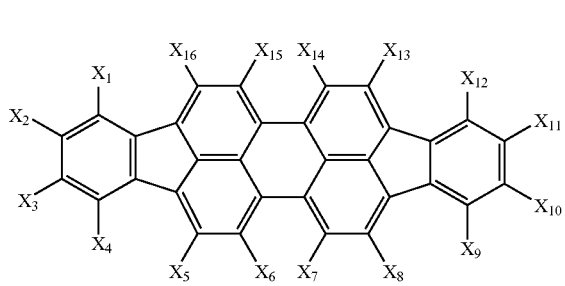

wherein:
$X_1$-$X_{16}$ are independently selected as hydrogen or substituents that include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen, provided that the substituents are selected to provide an emission maximum between 560 nm and 640 nm.

Illustrative examples of useful red dopants of this class are shown by Hatwar et al. in US Publication No. 2005/0249972, the contents of which are incorporated by reference.

Other red dopants useful in the present invention belong to the DCM class of dyes represented by Formula G:

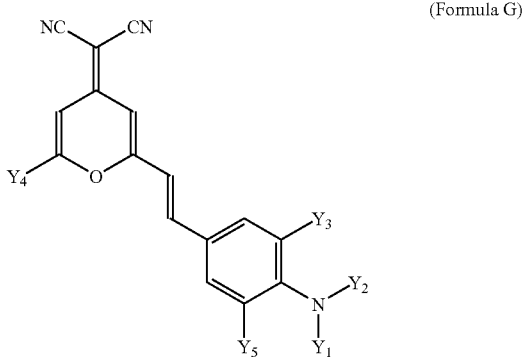

(Formula G)

wherein $Y_1$-$Y_5$ represent one or more groups independently selected from: hydro, alkyl, substituted alkyl, aryl, or substituted aryl; $Y_1$-$Y_5$ independently include acyclic groups or can be joined pairwise to form one or more fused rings; provided that $Y_3$ and $Y_5$ do not together form a fused ring.

In a useful and convenient embodiment that provides red luminescence, $Y_1$-$Y_5$ are selected independently from: hydro, alkyl and aryl. Structures of particularly useful dopants of the DCM class are shown by Ricks et al. in U.S. Patent Publication No. 2005/0181232, the contents of which are incorporated by reference.

A light-emitting yellow dopant can include a compound of the following structures:

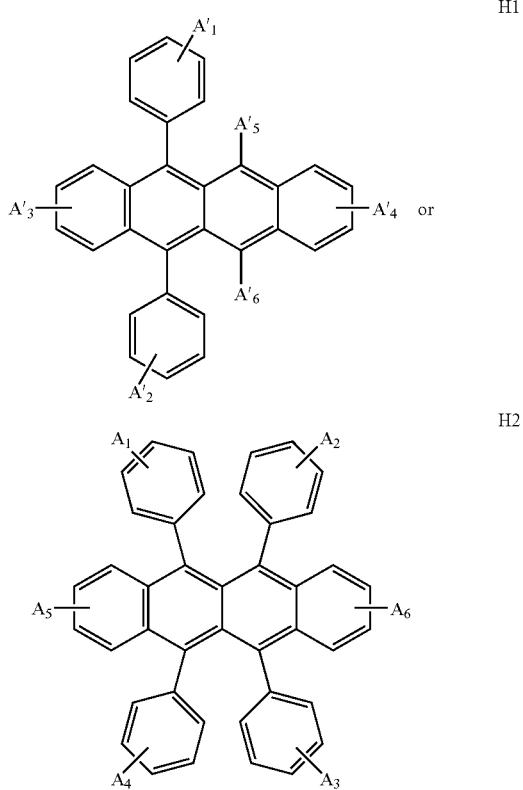

wherein $A_1$-$A_6$ and $A_1'$-$A_6'$ represent one or more substituents on each ring and where each substituent is individually selected from one of the following:

Category 1: hydrogen, or alkyl of from 1 to 24 carbon atoms;
Category 2: aryl or substituted aryl of from 5 to 20 carbon atoms;
Category 3: hydrocarbon containing 4 to 24 carbon atoms, completing a fused aromatic ring or ring system;
Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;
Category 5: alkoxylamino, alkylamino, or arylamino of from 1 to 24 carbon atoms; or
Category 6: fluoro, chloro, bromo or cyano.

Examples of particularly useful yellow dopants are shown by Ricks et al.

The green-light-emitting compound can include a quinacridone compound of the following structure:

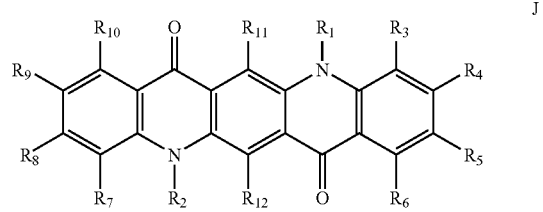

J wherein substituent groups R1 and R2 are independently alkyl, alkoxyl, aryl, or heteroaryl; and substituent groups R3 through R12 are independently hydrogen, alkyl, alkoxyl, halogen, aryl, or heteroaryl, and adjacent substituent groups R3 through R10 can optionally be connected to form one or more ring systems, including fused aromatic and fused heteroaromatic rings, provided that the substituents are selected to provide an emission maximum between 510 nm and 540 nm, and a full width at half maximum of 40 nm or less. Alkyl, alkoxyl, aryl, heteroaryl, fused aromatic ring and fused heteroaromatic ring substituent groups can be further substituted. Conveniently, R1 and R2 are aryl, and R2 through R12 are hydrogen, or substituent groups that are more electron withdrawing than methyl. Some examples of useful quinacridones include those disclosed in U.S. Pat. No. 5,593,788 and in US2004/0001969A1.

The green-light-emitting compound can include a coumarin compound of the following structure:

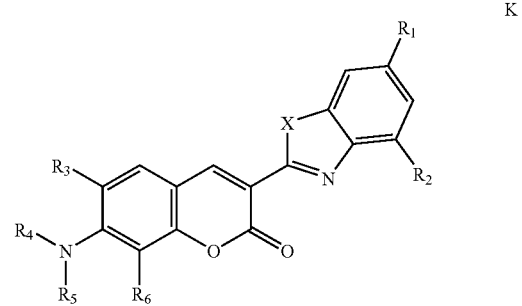

K wherein X is O or S; $R^1$, $R^2$, $R^3$ and $R^6$ can individually be hydrogen, alkyl, or aryl; $R^4$ and $R^5$ can individually be alkyl or aryl; or where either $R^3$ and $R^4$, or $R^5$ and $R^6$, or both together represent the atoms completing a cycloalkyl group; provided that the substituents are selected to provide an emission maximum between 510 nm and 540 nm, and a full width at half maximum of 40 nm or less.

Examples of useful green dopants are disclosed by Hatwar et al. in U.S. Patent Publication No. 2005/0181232.

The blue-light-emitting dopant can include perylene or derivatives thereof, or a bis(azinyl)azene boron complex compound of the structure L:

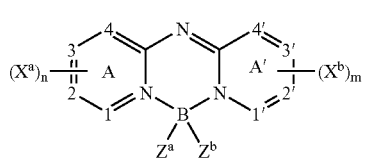

L wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Some examples of the above class of dopants are disclosed by Ricks et al.

Particularly useful blue dopants of the perylene class include perylene and tetra-t-butylperylene (TBP).

Another particularly useful class of blue dopants in this invention includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes of the general structure M1 shown below:

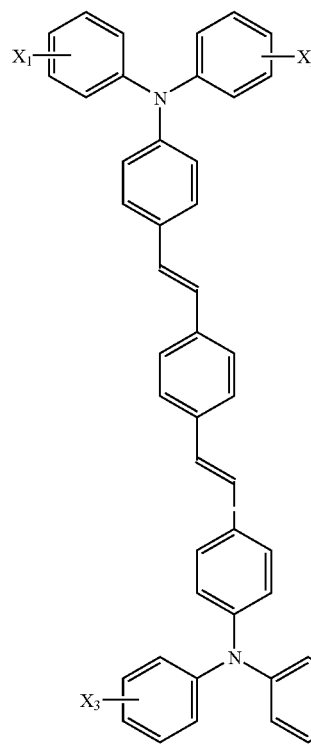

M1 and bis[2-[4-[N,N-diarylamino]phenyl]vinyl]biphenyls of the general structure M2 shown below:

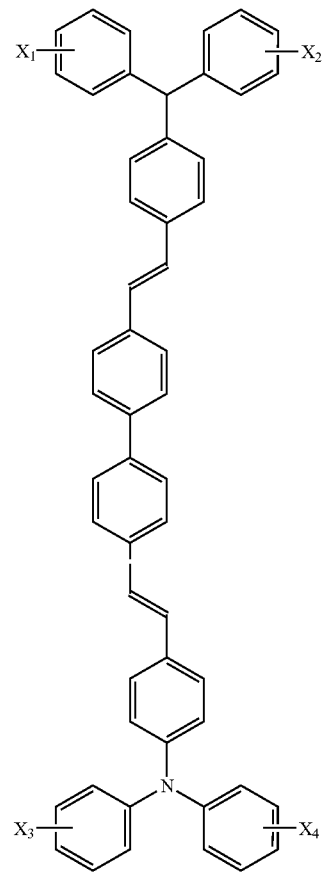

M2

In Formulas M1 and M2, $X_1$-$X_4$ can be the same or different, and individually represent one or more substituents such as alkyl, aryl, fused aryl, halo, or cyaNo. In a preferred embodiment, $X_1$-$X_4$ are individually alkyl groups, each containing from one to about ten carbon atoms. A particularly preferred blue dopant of this class is disclosed by Ricks et al.

While not always necessary, it is often useful to include an electron-transporting layer 55 disposed over the light-emitting layers. Desired electron-transporting materials can be deposited by any suitable means such as evaporation, sputtering, chemical vapor deposition, electrochemical means, thermal transfer, or laser thermal transfer from a donor material. Preferred electron-transporting materials for use in the electron-transporting layer are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Certain benzazoles are also useful electron-transporting materials. Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials known in the art.

An upper electrode most commonly configured as a cathode 90 is formed over the electron-transporting layer, or over the light-emitting layers if an electron-transporting layer is not used. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

OLED device 10 can include other layers as well. For example, a hole-injecting layer 35 can be formed over the anode, as described in U.S. Pat. No. 4,720,432, U.S. Pat. No. 6,208,075, EP 0 891 121 A1, and EP 1 029 909 A1. An electron-injecting layer 60, such as alkaline or alkaline earth metals, alkali halide salts, or alkaline or alkaline earth metal doped organic layers, can also be present between the cathode and the electron-transporting layer.

Figure 4:
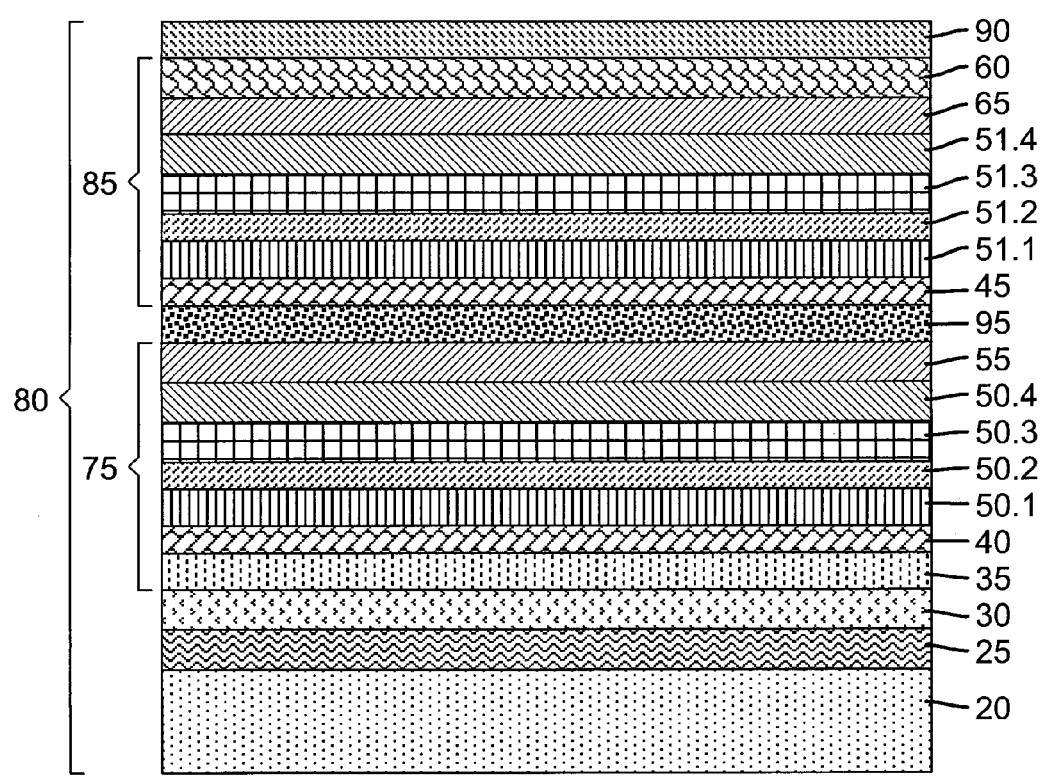
FIG. 4 shows a cross-sectional view of another OLED device in accordance with this invention.

Turning now to FIG. 4, there is shown a cross-sectional view of a pixel of a tandem white-light-emitting OLED device 80 according to another embodiment of the present invention. Tandem OLED devices have previously been disclosed by Jones et al. in U.S. Pat. No. 6,337,492, Tanaka et al. in U.S. Pat. No. 6,107,734, Kido et al. in JP Patent Publication 2003/045676A and in U.S. Patent Publication 2003/0189401 A1, and Liao et al. in U.S. Pat. No. 6,717,358 and U.S. Patent Application Publication 2003/0170491 A1. OLED device 80 includes a substrate 20, a spaced anode and cathode 90, and at least two white light-emitting units 75 and 85 disposed between the electrodes. White light-emitting units 75 and 85 produce emission spectra corresponding to white light. Each white light-emitting unit has four light-emitting layers: light-emitting layers 50.1, 50.2, 50.3, and 50.4 for white light-emitting unit 75, and light-emitting layers 51.1, 51.2, 51.3, and 51.4 for white light-emitting unit 85. Each light-emitting unit includes a red light-emitting layer, a yellow light-emitting layer, a blue light-emitting layer, and a green light-emitting layer. Each of the light-emitting layers of a given white light-emitting unit produces a different emission spectrum when current passes between anode 30 and cathode 90. These emission spectra combine to form white light. White light-emitting units 75 and 85 can have the structure of any of those described in FIG. 2a through FIG. 2h, according to the criteria described above for OLED device 10. White light-emitting units 75 and 85 can have the same order of light-emitting layers, or can have different orders. For example, one embodiment of tandem OLED device 80 can have the structure wherein both white light-emitting units 75 and 85 have the same layer order, e.g. that of FIG. 2b. A different embodiment of tandem OLED device 80 can have the structure wherein white light-emitting unit 75 has a layer order of, e.g. that of FIG. 2a, while white light-emitting unit 85 has a different layer order, e.g. that of FIG. 2e. Further, the light-emitting layers used can be the same or different (e.g. white light-emitting units 75 and 85 can have red light-emitting layers of the same or different composition, etc.)

Tandem OLED device 80 further includes an intermediate connector 95 disposed between white light-emitting units 75 and 85. The intermediate connector provides effective carrier injection into the adjacent EL units. Metals, metal compounds, or other inorganic compounds are effective for carrier injection. However, such materials often have low resistivity, which can result in pixel crosstalk. Also, the optical transparency of the layers constituting the intermediate connector should be as high as possible to permit for radiation produced in the EL units to exit the device. Therefore, it is often preferred to use mainly organic materials in the intermediate connector. Intermediate connector 95 and materials used in its construction have been described in detail by Hatwar et al. in U.S. patent application Ser. No. 11/170,681. Some further non-limiting examples of intermediate connectors are described in U.S. Pat. Nos. 6,717,358 and 6,872,472, and U.S. Patent Application Publication 2004/0227460 A1.

Figure 6:
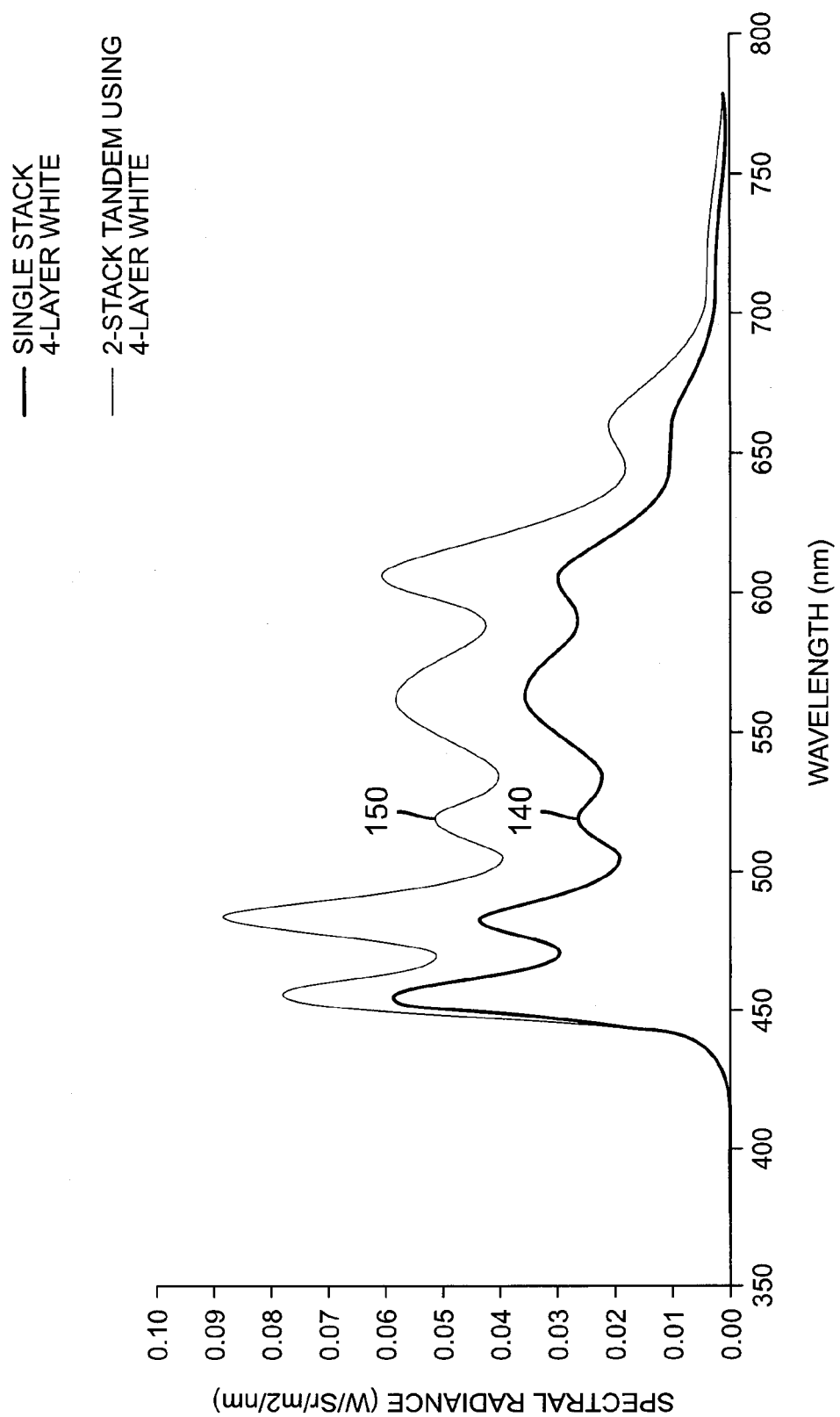
FIG. 6 shows a comparison of the emission spectrum of a four-layer white-light-emitting OLED device according to this invention with the emission spectrum of a four-layer white-light-emitting single-stack OLED device.

Turning now to FIG. 6, there is shown an emission spectrum 150 of a tandem OLED device as shown in FIG. 4. For comparison, spectrum 140 shows a single-stack OLED device with four light-emitting layers as described herein. While both have good emission across much of the visible spectrum the tandem OLED device shows greater radiance.

The invention and its advantages can be better appreciated by the following comparative examples. The layers described as vacuum-deposited were deposited by evaporation from heated boats under a vacuum of approximately $10^{-6}$ Torr. After deposition of the OLED layers each device was then transferred to a dry box for encapsulation. The OLED has an emission area of 10 mm$^2$. The devices were tested by applying a current of 20 mA/cm$^2$ across electrodes. The performance of the devices is given in Table 1. The color gamut for each device was calculated relative to the aim NTSC red, green, and blue color coordinates as measured in CIEx,y space.

EXAMPLE 1

Comparative Two-layer

A comparative color OLED display was constructed in the following manner:
1. A clean glass substrate was deposited by sputtering with indium tin oxide (ITO) to form a transparent electrode of 85 nm thickness.
2. The above-prepared ITO surface was treated with a plasma oxygen etch.
3. The above-prepared substrate was further treated by vacuum-depositing a 10 nm layer of hexacyano-hexaazatriphenylene (CHATP) as a hole-injecting layer (HIL).

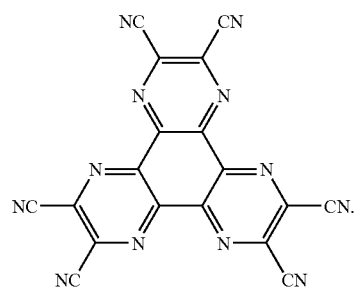

CHATP

4. The above-prepared substrate was further treated by vacuum-depositing a 10 nm layer of 4,4'-bis[N-(1-naphthyl)-N-phenylamino]biphenyl (NPB) as a hole-transporting layer (HTL).
5. The above-prepared substrate was further treated by vacuum-depositing a 20 nm yellow light-emitting layer including 14 nm NPB (as host) and 6 nm 9,10-bis(2-naphthyl)anthracene (ADN) as a stabilizer with 2% yellow-orange emitting dopant diphenyltetra-t-butylrubrene (PTBR).

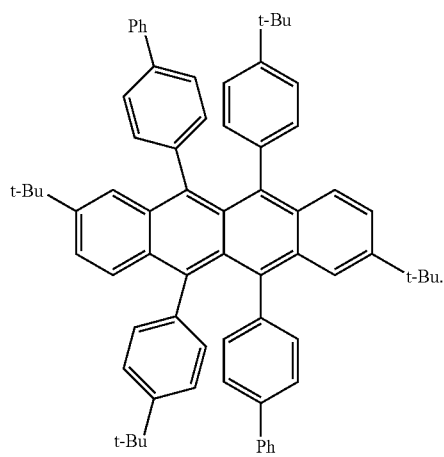

PTBR

6. The above-prepared substrate was further treated by vacuum-depositing a 20 nm blue light-emitting layer including 18.4 nm 9-(2-naphthyl)-10-(4-biphenyl)anthracene (BNA) host and 1.4 nm NPB cohost with 1% BEP as blue-emitting dopant.

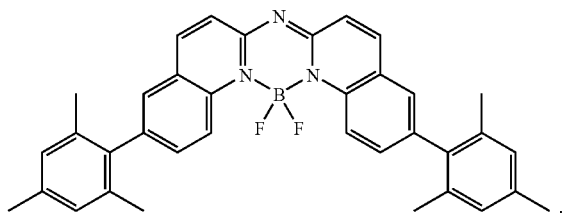

BEP

7. A 40 nm mixed electron-transporting layer was vacuum-deposited, including 200 nm 4,7-diphenyl-1,10-phenanthroline (also known as bathophen or Bphen), 200 nm tris(8-quinolinolato)aluminum (III) (ALQ) as co-host, with 2% Li metal.
8. A 100 nm layer of aluminum was evaporatively deposited onto the substrate to form a cathode layer.

EXAMPLE 2

Comparative Three-layer

A comparative color OLED display was constructed in the following manner:
1. A clean glass substrate was deposited by sputtering with ITO to form a transparent electrode of 60 nm thickness.
2. The above-prepared ITO surface was treated with a plasma oxygen etch.
3. The above-prepared substrate was further treated by vacuum-depositing a 10 nm layer of CHATP as a hole-injecting layer (HIL).
4. The above-prepared substrate was further treated by vacuum-depositing a 10 nm layer of NPB as a hole-transporting layer (HTL).
5. The above-prepared substrate was further treated by vacuum-depositing a 20 nm red light-emitting layer including 14 nm of NPB and 6 nm BNA as a stabilizer doped with 0.5% dibenzo {[f,f']-4,4'7,7'-tetraphenyl] diindeno-[1,2,3-cd:1',2',3'-lm]perylene (TPDBP) as a red emitting dopant.
6. The above-prepared substrate was further treated by vacuum-depositing a 15 nm blue light-emitting layer including 14 nm BNA host and 1 nm NPB cohost with 1% BEP as blue-emitting dopant.
7. The above-prepared substrate was further treated by vacuum-depositing a 15 nm green light-emitting layer including 14 nm BNA, 1 nm NPB, and 0.5% diphenylquinacridone (DPQ) as green emitting dopant.
8. A 40 nm mixed electron-transporting layer was vacuum-deposited, including 200 nm Bphen, 200 nm tris(8-quinolinolato)aluminum (III) (ALQ) as co-host, with 2% Li metal.
9. A 100 nm layer of aluminum was evaporatively deposited onto the substrate to form a cathode layer.

EXAMPLE 3

Inventive

An inventive color OLED display was constructed in the following manner:

1. A clean glass substrate was deposited by sputtering with ITO to form a transparent electrode of 60 nm thickness.
2. The above-prepared ITO surface was treated with a plasma oxygen etch.
3. The above-prepared substrate was further treated by vacuum-depositing a 10 nm layer of CHATP as a hole-injecting layer (HIL).
4. The above-prepared substrate was further treated by vacuum-depositing a 10 nm layer of NPB as a hole-transporting layer (HTL).
5. The above-prepared substrate was further treated by vacuum-depositing a 18 nm red light-emitting layer including 12.6 nm of NPB and 5.4 nm BNA as a stabilizer doped with 0.5% TPDBP as a red emitting dopant.
6. The above-prepared substrate was further treated by vacuum-depositing a 2 nm yellow light-emitting layer including 1.4 nm NPB (as host) and 0.6 nm ADN as a stabilizer with 3% yellow-orange emitting dopant PTBR.
7. The above-prepared substrate was further treated by vacuum-depositing a 15 nm blue light-emitting layer including 14 nm BNA host and 1 nm NPB cohost with 1% BEP as blue-emitting dopant.
8. The above-prepared substrate was further treated by vacuum-depositing a 15 nm green light-emitting layer including 14 nm BNA, 1 nm NPB, and 0.5% DPQ as green emitting dopant.
9. A 40 nm mixed electron-transporting layer was vacuum-deposited, including 200 nm Bphen, 200 nm ALQ as co-host, with 2% Li metal.
10. A 100 nm layer of aluminum was evaporatively deposited onto the substrate to form a cathode layer.

EXAMPLE 4

Inventive

An inventive color OLED display was constructed in the following manner:
1. A clean glass substrate was deposited by sputtering with ITO to form a transparent electrode of 60 nm thickness.
2. The above-prepared ITO surface was treated with a plasma oxygen etch.
3. The above-prepared substrate was further treated by vacuum-depositing a 10 nm layer of CHATP as a hole-injecting layer (HIL).
4. The above-prepared substrate was further treated by vacuum-depositing a 10 nm layer of NPB as a hole-transporting layer (HTL).
5. The above-prepared substrate was further treated by vacuum-depositing a 16 nm red light-emitting layer including 11.2 nm of NPB and 4.8 nm BNA as a stabilizer doped with 0.5% TPDBP as a red emitting dopant.
6. The above-prepared substrate was further treated by vacuum-depositing a 4 nm yellow light-emitting layer including 2.8 nm NPB (as host) and 1.2 nm ADN as a stabilizer with 3% yellow-orange emitting dopant PTBR.
7. The above-prepared substrate was further treated by vacuum-depositing a 15 nm blue light-emitting layer including 14 nm BNA host and 1 nm NPB cohost with 1% BEP as blue-emitting dopant.
8. The above-prepared substrate was further treated by vacuum-depositing a 15 nm green light-emitting layer including 14 nm BNA, 1 nm NPB, and 0.5% DPQ as green emitting dopant.
9. A 40 nm mixed electron-transporting layer was vacuum-deposited, including 200 nm Bphen, 200 nm ALQ as co-host, with 2% Li metal.
10. A 100 nm layer of aluminum was evaporatively deposited onto the substrate to form a cathode layer.

EXAMPLE 5

Inventive

An inventive color OLED display was constructed in the following manner:
1. A clean glass substrate was deposited by sputtering with ITO to form a transparent electrode of 60 nm thickness.
2. The above-prepared ITO surface was treated with a plasma oxygen etch.
3. The above-prepared substrate was further treated by vacuum-depositing a 10 nm layer of CHATP as a hole-injecting layer (HIL).
4. The above-prepared substrate was further treated by vacuum-depositing a 21 nm red light-emitting layer including 14 nm of NPB and 6 nm BNA as a stabilizer doped with 0.5% TPDBP as a red emitting dopant.
5. The above-prepared substrate was further treated by vacuum-depositing a 3 nm yellow light-emitting layer including 2 nm NPB (as host) and 1 nm ADN as a stabilizer with 2% yellow-orange emitting dopant PTBR.
6. The above-prepared substrate was further treated by vacuum-depositing a 15 nm blue light-emitting layer including 14.5 nm BNA host and 0.5 nm NPB cohost with 1% BEP as blue-emitting dopant.
7. The above-prepared substrate was further treated by vacuum-depositing a 15 nm green light-emitting layer including 14.5 nm BNA, 0.5 nm NPB, and 0.5% DPQ as green emitting dopant.
8. A 40 nm mixed electron-transporting layer was vacuum-deposited, including 200 nm Bphen, 200 nm ALQ as co-host, with 2% Li metal.
9. A 100 nm layer of aluminum was evaporatively deposited onto the substrate to form a cathode layer.

EXAMPLE 6

Inventive Tandem Device

An inventive color OLED display was constructed in the following manner:

1. A clean glass substrate was deposited by sputtering with ITO to form a transparent electrode of 60 nm thickness.
2. The above-prepared ITO surface was treated with a plasma oxygen etch.
3. The above-prepared substrate was further treated by vacuum-depositing a 10 nm layer of CHATP as a hole-injecting layer (HIL).
4. The above-prepared substrate was further treated by vacuum-depositing a 21 nm red light-emitting layer including 14 nm of NPB and 6 nm BNA as a stabilizer doped with 0.5% TPDBP as a red emitting dopant.
5. The above-prepared substrate was further treated by vacuum-depositing a 3 nm yellow light-emitting layer including 2 nm NPB (as host) and 1 nm ADN as a stabilizer with 2% yellow-orange emitting dopant PTBR.
6. The above-prepared substrate was further treated by vacuum-depositing a 15 nm blue light-emitting layer including 14.5 nm BNA host and 0.5 nm NPB cohost with 1% BEP as blue-emitting dopant.
7. The above-prepared substrate was further treated by vacuum-depositing a 15 nm green light-emitting layer including 14.5 nm BNA, 0.5 nm NPB, and 0.5% DPQ as green emitting dopant.
8. A 40 nm n-type doped organic layer was vacuum-deposited, including 200 nm Bphen, 200 nm ALQ as co-host, and 2% Li metal.
9. The above-prepared substrate was further treated by vacuum-depositing a 10 nm layer of CHATP as a p-type doped organic layer (HIL).
10. The above-prepared substrate was further treated by vacuum-depositing a 30 nm layer of NPB as a hole-transporting layer (HTL).
11. The above-prepared substrate was further treated by vacuum-depositing a 21 nm red light-emitting layer including 14 nm of NPB and 6 nm BNA as a stabilizer doped with 0.5% TPDBP as a red emitting dopant.
12. The above-prepared substrate was further treated by vacuum-depositing a 3 nm yellow light-emitting layer including 2 nm NPB (as host) and 1 nm ADN as a stabilizer with 2% yellow-orange emitting dopant PTBR.
13. The above-prepared substrate was further treated by vacuum-depositing a 15 nm blue light-emitting layer including 14.5 nm BNA host and 0.5 nm NPB cohost with 1% BEP as blue-emitting dopant.
14. The above-prepared substrate was further treated by vacuum-depositing a 15 nm green light-emitting layer including 14.5 nm BNA, 0.5 nm NPB, and 0.5% DPQ as green emitting dopant.
15. A 40 nm mixed electron-transporting layer was vacuum-deposited, including 200 nm Bphen, 200 nm ALQ as co-host, with 2% Li metal.
16. A 100 nm layer of aluminum was evaporatively deposited onto the substrate to form a cathode layer.

The results of testing these examples are shown in Table 1, below. Comparative Examples 1 and 2 show that it is difficult to achieve both efficiency and effective color gamut. Example 1 has good efficiency but low color gamut. Example 2 has effective color gamut, but both luminance and power efficiencies are degraded relative to Example 1. In addition, Example 2 is an example of a broadband that is far from D65 white.

In the present invention, improved efficiency, white point, and color gamut are achieved by a four-layer emitting structure, including red-, yellow-, green-, and blue-light-emitting layers, as shown by Examples 3 to 5. Further improvements in efficiency are possible by using this structure in a tandem device, as in Example 6.

The invention has been described in detail with particular reference to certain preferred embodiments thereof, but it will be understood that variations and modifications can be effected within the spirit and scope of the invention.

TABLE 1

Device data measured at 20 mA/cm$^2$

| Device # | | Voltage | Lum Efficiency (cd/A) | Power Efficiency (W/A) | CIEx | CIEy | lm/W | QE % | Room Temp Fade Stability @80 mA/cm$^2$ (hrs to 50%) | Color Gamut: NTSC ratio (%) |
|---|---|---|---|---|---|---|---|---|---|---|
| Example 1 (Comparative) | 2-layer white | 3.7 | 11.4 | 0.106 | 0.357 | 0.357 | 9.7 | 4.7 | 1000 | 50 |
| Example 2 (Comparative) | 3-layer white | 4.5 | 6.1 | 0.079 | 0.240 | 0.285 | 4.3 | 3.3 | 800 | 75 |
| Example 3 (Inventive) | 4-layer white 2 nm yellow layer | 4.5 | 8.5 | 0.086 | 0.317 | 0.358 | 6.0 | 3.8 | 1045 | 71 |
| Example 4 (Inventive) | 4-layer white 4 nm yellow layer | 4.3 | 9.5 | 0.091 | 0.323 | 0.369 | 6.9 | 4.0 | 896 | 71 |
| Example 5 (Inventive) | 4-layer white 3 nm yellow layer | 4.5 | 9.8 | 0.099 | 0.316 | 0.344 | 6.9 | 4.0 | 700 | 70 |
| Example 6 (Inventive) | 4-layer white 2-stack tandem, 3 nm yellow | 8.7 | 17.5 | 0.175 | 0.327 | 0.366 | 6.3 | 7.7 | 562 | 70 |

PARTS LIST 5r pixel
5g pixel
5b pixel
5w pixel
10 OLED device
15 OLED display
20 substrate
25 color filter
25r red color filter
25g green color filter
25b blue color filter
30 anode
30r anode
30g anode
30b anode
30w anode
35 hole-injecting layer
40 hole-transporting layer
45 hole-transporting layer
50.1 light-emitting layer
50.2 light-emitting layer
50.3 light-emitting layer
50.4 light-emitting layer
50r red light-emitting layer
50y yellow light-emitting layer
50b blue light-emitting layer
50g green light-emitting layer
51.1 light-emitting layer
51.2 light-emitting layer
51.3 light-emitting layer
51.4 light-emitting layer
55 electron-transporting layer
60 electron-injecting layer
65 electron-transporting layer
70 organic EL element
75 white light-emitting unit
80 OLED device
85 white light-emitting unit
90 cathode
95 intermediate connector
97 white light
97r red light
97g green light
97b blue light
97w white light
110 spectrum
120 spectrum
130 spectrum
140 spectrum
150 spectrum

What is claimed is:

1. A white light-emitting OLED device comprising:
   a) an anode and a cathode;
   b) at least four light-emitting layers provided between the anode and the cathode, wherein each of the four light-emitting layers produces a different emission spectrum when current passes between the anode and cathode, and such spectra combine to form white light; and
   c) wherein the four light-emitting layers include a red light-emitting layer, a yellow light-emitting layer, a blue light-emitting layer, and a green light-emitting layer, arranged such that:
      i) each of the light-emitting layers is in contact with at least one other light-emitting layer,
      ii) the blue light-emitting layer is in contact with the green light-emitting layer, and
      iii) the red light-emitting layer is in contact with only one other light-emitting layer.

2. The white light-emitting OLED device of claim 1 wherein the red light-emitting layer is formed closest to the anode, the yellow light-emitting layer has a thickness greater than 0.5 nm and less than 5 nm and is in contact with the red light-emitting layer, the blue light-emitting layer is in contact with the yellow light-emitting layer, and the green light-emitting layer is in contact with the blue light-emitting layer.

3. The white light-emitting OLED device of claim 1 wherein the red light-emitting layer is formed closest to the anode, the yellow light-emitting layer has a thickness greater than 0.5 nm and less than 5 nm and is in contact with the red light-emitting layer, the green light-emitting layer has a thickness greater than 0.5 nm and less than 20 nm and is in contact with the yellow light-emitting layer, and the blue light-emitting layer is in contact with the green light-emitting layer.

4. The white light-emitting OLED device of claim 1 wherein the red light-emitting layer is formed closest to the anode, the blue light-emitting layer is in contact with the red light-emitting layer, the green light-emitting layer has a thickness greater than 0.5 nm and less than 20 nm and is in contact with the blue light-emitting layer, and the yellow light-emitting layer is in contact with the green light-emitting layer.

5. The white light-emitting OLED device of claim 1 wherein the red light-emitting layer is formed closest to the anode, the green light-emitting layer has a thickness greater than 0.5 nm and less than 20 nm and is in contact with the red light-emitting layer, the blue light-emitting layer is in contact with the green light-emitting layer, and the yellow light-emitting layer is in contact with the blue light-emitting layer.

6. The white light-emitting OLED device of claim 1 wherein the yellow light-emitting layer is formed closest to the anode, the blue light-emitting layer is in contact with the yellow light-emitting layer, the green light-emitting layer has a thickness greater than 0.5 nm and less than 20 nm and is in contact with the blue light-emitting layer, and the red light-emitting layer is in contact with the green light-emitting layer.

7. The white light-emitting OLED device of claim 1 wherein the yellow light-emitting layer is formed closest to the anode, the green light-emitting layer has a thickness greater than 0.5 nm and less than 20 nm and is in contact with the yellow light-emitting layer, the blue light-emitting layer is in contact with the green light-emitting layer, and the red light-emitting layer is in contact with the blue light-emitting layer.

8. The white light-emitting OLED device of claim 1 wherein the green light-emitting layer is formed closest to the anode, the blue light-emitting layer is in contact with the green light-emitting layer, the yellow light-emitting layer has a thickness greater than 0.5 nm and less than 5 nm and is in contact with the blue light-emitting layer, and the red light-emitting layer is in contact with the yellow light-emitting layer.

9. The white light-emitting OLED device of claim 1 wherein the blue light-emitting layer is formed closest to the anode, the green light-emitting layer has a thickness greater than 0.5 nm and less than 20 nm and is in contact with the blue light-emitting layer, the yellow light-emitting layer has a thickness greater than 0.5 nm and less than 5 nm and is in contact with the green light-emitting layer, and the red light-emitting layer is in contact with the yellow light-emitting layer.

10. A white light-emitting OLED display comprising:
a) an array of first, second, third, and fourth light-emitting pixels, each pixel having an anode, a cathode, and at least four light-emitting layers provided between the anode and the cathode, wherein each of the four light-emitting layers produces a different emission spectrum when current passes between the anode and cathode;
b) wherein the four light-emitting layers include a red light-emitting layer, a yellow light-emitting layer, a blue light-emitting layer, and a green light-emitting layer, arranged such that:
  i) each of the light-emitting layers is in contact with at least one other light-emitting layer,
  ii) the blue light-emitting layer is in contact with the green light-emitting layer, and
  iii) the red light-emitting layer is in contact with only one other light-emitting layer; and
c) an array of at least three different color filters in operative association with the first, second, and third light-emitting pixels, such filters being selected to receive white light to produce different colored light.

11. The white light-emitting OLED device of claim 10 wherein the red light-emitting layer is formed closest to the anode, the yellow light-emitting layer has a thickness greater than 0.5 nm and less than 5 nm and is in contact with the red light-emitting layer, the blue light-emitting layer is in contact with the yellow light-emitting layer, and the green light-emitting layer is in contact with the blue light-emitting layer.

12. The white light-emitting OLED device of claim 10 wherein the red light-emitting layer is formed closest to the anode, the yellow light-emitting layer has a thickness greater than 0.5 nm and less than 5 nm and is in contact with the red light-emitting layer, the green light-emitting layer has a thickness greater than 0.5 nm and less than 20 nm and is in contact with the yellow light-emitting layer, and the blue light-emitting layer is in contact with the green light-emitting layer.

13. The white light-emitting OLED device of claim 10 wherein the red light-emitting layer is formed closest to the anode, the blue light-emitting layer is in contact with the red light-emitting layer, the green light-emitting layer has a thickness greater than 0.5 nm and less than 20 nm and is in contact with the blue light-emitting layer, and the yellow light-emitting layer is in contact with the green light-emitting layer.

14. The white light-emitting OLED device of claim 10 wherein the red light-emitting layer is formed closest to the anode, the green light-emitting layer has a thickness greater than 0.5 nm and less than 20 nm and is in contact with the red light-emitting layer, the blue light-emitting layer is in contact with the green light-emitting layer, and the yellow light-emitting layer is in contact with the blue light-emitting layer.

15. The white light-emitting OLED device of claim 10 wherein the yellow light-emitting layer is formed closest to the anode, the blue light-emitting layer is in contact with the yellow light-emitting layer, the green light-emitting layer has a thickness greater than 0.5 nm and less than 20 nm and is in contact with the blue light-emitting layer, and the red light-emitting layer is in contact with the green light-emitting layer.

16. The white light-emitting OLED device of claim 10 wherein the yellow light-emitting layer is formed closest to the anode, the green light-emitting layer has a thickness greater than 0.5 nm and less than 20 nm and is in contact with the yellow light-emitting layer, the blue light-emitting layer is in contact with the green light-emitting layer, and the red light-emitting layer is in contact with the blue light-emitting layer.

17. The white light-emitting OLED device of claim 10 wherein the green light-emitting layer is formed closest to the anode, the blue light-emitting layer is in contact with the green light-emitting layer, the yellow light-emitting layer has a thickness greater than 0.5 nm and less than 5 nm and is in contact with the blue light-emitting layer, and the red light-emitting layer is in contact with the yellow light-emitting layer.

18. The white light-emitting OLED device of claim 10 wherein the blue light-emitting layer is formed closest to the anode, the green light-emitting layer has a thickness greater than 0.5 nm and less than 20 nm and is in contact with the blue light-emitting layer, the yellow light-emitting layer has a thickness greater than 0.5 nm and less than 5 nm and is in contact with the green light-emitting layer, and the red light-emitting layer is in contact with the yellow light-emitting layer.

19. The white light-emitting OLED display of claim 10 wherein all the pixels of the array share a common cathode.

20. A tandem white light-emitting OLED device comprising:
a) a spaced anode and cathode;
b) at least two white light-emitting units that are disposed between the electrodes and that produce emission spectra corresponding to white light and each white light-emitting unit having four light-emitting layers including a red light-emitting layer, a yellow light-emitting layer, a blue light-emitting layer, and a green light-emitting layer, arranged such that:
  i) each of the light-emitting layers of a white light-emitting unit is in contact with at least one other light-emitting layer of that unit,
  ii) the blue light-emitting layer of a white light-emitting unit is in contact with the green light-emitting layer of that unit, and
  iii) the red light-emitting layer of a white light-emitting unit is in contact with only one other light-emitting layer of that unit; and
c) an intermediate connector disposed between the white light-emitting units.

21. The tandem white light-emitting OLED device of claim 20 wherein at least one of the white light-emitting units has the structure comprising: the red light-emitting layer being formed closest to the anode, the yellow light-emitting layer having a thickness greater than 0.5 nm and less than 5 nm and being in contact with the red light-emitting layer, the blue light-emitting layer being in contact with the yellow light-emitting layer, and the green light-emitting layer being in contact with the blue light-emitting layer.

22. The tandem white light-emitting OLED device of claim 20 wherein at least one of the white light-emitting units has the structure comprising: the red light-emitting layer being formed closest to the anode, the yellow light-emitting layer having a thickness greater than 0.5 nm and less than 5 nm and being in contact with the red light-emitting layer, the green light-emitting layer having a thickness greater than 0.5 nm and less than 20 nm and being in contact with the yellow light-emitting layer, and the blue light-emitting layer being in contact with the green light-emitting layer.

23. The tandem white light-emitting OLED device of claim 20 wherein at least one of the white light-emitting units has the structure comprising: the red light-emitting layer being formed closest to the anode, the blue light-emitting layer being in contact with the red light-emitting layer, the green light-emitting layer having a thickness greater than 0.5 nm and less than 20 nm and being in contact with the blue light-emitting layer, and the yellow light-emitting layer being in contact with the green light-emitting layer.

24. The tandem white light-emitting OLED device of claim 20 wherein at least one of the white light-emitting units has the structure comprising: the red light-emitting layer being formed closest to the anode, the green light-emitting layer having a thickness greater than 0.5 nm and less than 20 nm and being in contact with the red light-emitting layer, the blue light-emitting layer being in contact with the green light-emitting layer, and the yellow light-emitting layer being in contact with the blue light-emitting layer.

25. The tandem white light-emitting OLED device of claim 20 wherein at least one of the white light-emitting units has the structure comprising: the yellow light-emitting layer being formed closest to the anode, the blue light-emitting layer being in contact with the yellow light-emitting layer, the green light-emitting layer having a thickness greater than 0.5 nm and less than 20 nm and being in contact with the blue light-emitting layer, and the red light-emitting layer being in contact with the green light-emitting layer.

26. The tandem white light-emitting OLED device of claim 20 wherein at least one of the white light-emitting units has the structure comprising: the yellow light-emitting layer being formed closest to the anode, the green light-emitting layer having a thickness greater than 0.5 nm and less than 20 nm and being in contact with the yellow light-emitting layer, the blue light-emitting layer being in contact with the green light-emitting layer, and the red light-emitting layer being in contact with the blue light-emitting layer.

27. The tandem white light-emitting OLED device of claim 20 wherein at least one of the white light-emitting units has the structure comprising: the green light-emitting layer being formed closest to the anode, the blue light-emitting layer being in contact with the green light-emitting layer, the yellow light-emitting layer having a thickness greater than 0.5 nm and less than 5 nm and being in contact with the blue light-emitting layer, and the red light-emitting layer being in contact with the yellow light-emitting layer.

28. The tandem white light-emitting OLED device of claim 20 wherein at least one of the white light-emitting units has the structure comprising: the blue light-emitting layer being formed closest to the anode, the green light-emitting layer having a thickness greater than 0.5 nm and less than 20 nm and being in contact with the blue light-emitting layer, the yellow light-emitting layer having a thickness greater than 0.5 nm and less than 5 nm and being in contact with the green light-emitting layer, and the red light-emitting layer being in contact with the yellow light-emitting layer.

29. The white light-emitting OLED device of claim 1 wherein each of the four light emitting layers includes an anthracene derivative.

30. The white light emitting OLED device of claim 29 wherein the anthracene derivative in the four light emitting layers is a monoanthracene derivative.

31. The tandem white light-emitting OLED device of claim 20 wherein each of the four light emitting layers in each white light emitting unit includes an anthracene derivative.

32. The tandem white light-emitting OLED device of claim 31 wherein the anthracene derivative in each of the four light emitting layers in each white light emitting unit is a monoanthracene derivative.

* * * * *